US010084486B1

(12) United States Patent
Zhu et al.

(10) Patent No.: US 10,084,486 B1
(45) Date of Patent: Sep. 25, 2018

(54) HIGH SPEED TURBO DECODER

(71) Applicant: Intel Corporation, Santa Clara, CA (US)

(72) Inventors: Jianbin Zhu, San Diego, CA (US); Yi Zhou, Irvine, CA (US); Yuzhou Zhang, San Diego, CA (US); Yuan Li, San Diego, CA (US); Chuong Vu, Irvine, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/720,905

(22) Filed: Sep. 29, 2017

(51) Int. Cl.
| | |
|---|---|
| *H04L 5/12* | (2006.01) |
| *H04L 23/02* | (2006.01) |
| *H03M 13/29* | (2006.01) |
| *H04L 1/00* | (2006.01) |
| *H03M 13/39* | (2006.01) |
| *H03M 13/00* | (2006.01) |

(52) U.S. Cl.
CPC ... *H03M 13/2957* (2013.01); *H03M 13/3927* (2013.01); *H04L 1/0055* (2013.01); *H03M 13/6561* (2013.01)

(58) Field of Classification Search
CPC ......... H03M 13/2957; H03M 13/6561; H03M 13/3927; H03M 13/4138; H03M 13/3905; H03M 13/1105; H04L 1/0055
USPC ........................................ 375/265, 341, 262
See application file for complete search history.

(56) References Cited

U.S. PATENT DOCUMENTS

| | | | | |
|---|---|---|---|---|
| 7,055,089 B2* | 5/2006 | Miyauchi | .......... | H03M 13/4138 714/780 |
| 2002/0174401 A1* | 11/2002 | Wang | ................ | H03M 13/3905 714/786 |
| 2006/0270369 A1* | 11/2006 | Hahm | ............... | H03M 13/2975 455/130 |
| 2007/0055919 A1* | 3/2007 | Li | ..................... | H03M 13/2957 714/755 |
| 2009/0110125 A1* | 4/2009 | Laprade | ............ | H03M 13/2957 375/341 |
| 2010/0146360 A1* | 6/2010 | Trofimenko | ....... | H03M 13/1105 714/752 |

(Continued)

*Primary Examiner* — Phuong Phu
(74) *Attorney, Agent, or Firm* — Schiff Hardin LLP

(57) ABSTRACT

A method for decoding a received code using a device that includes: an antenna for receiving a signal over a wireless channel, and instances of a Maximum-A-Posteriori (MAP) turbo decoder for decoding a segment of the received code, are disclosed. For example, the method, by forward and backward gamma engines, for each window, concurrently computes gamma branch metrics in forward and backward directions, respectively, by forward and backward state metric engines comprising respective lambda engines and coupled to the respective gamma engines, for each window, sequentially computes forward and backward state metrics, respectively, based on respective gamma branch metrics and respective initial values, by the lambda engines, determines Log Likelihood Ratios (LLRs) and soft decisions, and by a post-processor, computes extrinsic data based on the forward and backward state metrics for any subsequent iteration as at least a portion of the a-priori information and otherwise provides a decoded segment.

25 Claims, 6 Drawing Sheets

(56) References Cited

U.S. PATENT DOCUMENTS

2011/0022926 A1* 1/2011 Hu .................... H03M 13/3905
 714/752
2011/0276861 A1* 11/2011 Chun ................ H03M 13/2957
 714/780
2012/0106683 A1* 5/2012 Zhao ................ H03M 13/2957
 375/341

* cited by examiner

HIGH SPEED TURBO DECODER

The present disclosure describes a method for decoding a received code at high speed and a device including one or more instances of a Maximum-A-Posteriori (MAP) turbo decoder. Although, the method is described for decoding a code received by a device receiving wireless signals over a wireless channel of a Long Term Evolution (LTE) network, the method may be implemented for signals transmitted and/or received over any type of wireless network, e.g., a 3G network, a 5G network, a Wi-Fi network, and the like.

BACKGROUND

As wireless networks have become ubiquitous, users have become reliant on their wireless devices and the amount of data traversing wireless networks continues to grow. In order to support a large amount of data, turbo codes that provide a gain in coding efficiency may be used. However, the decoding by a receiver device may be inefficient. For example, the decoding may include: receiving a code (e.g., turbo coded data), storing in memory, chopping the received code into segments for processing by a turbo decoder, and feeding each segment to a turbo decoder for decoding. The turbo decoding of a segment requires retrieving samples from memory. As such, memory contention may occur.

One approach to address the memory contention is to turbo decode each segment by accessing memory locations sequentially (i.e., one memory location at a time) and reading the samples stored at the accessed location. However, the sequential reading of samples of data from memory limits the speed of the turbo decoder. As such, this approach is sub-optimal for receivers intended to support applications with high data rates, e.g., high definition video applications, gaming applications, and the like.

BRIEF DESCRIPTION OF THE DRAWINGS

The teaching of the present disclosure can be more fully understood by reading the subsequent detailed description and examples in conjunction with references made to the accompanying drawings, in which.

To facilitate reading, identical reference numbers are used to designate elements that are common to various figures, where possible.

DETAILED DESCRIPTION

Figure 1:
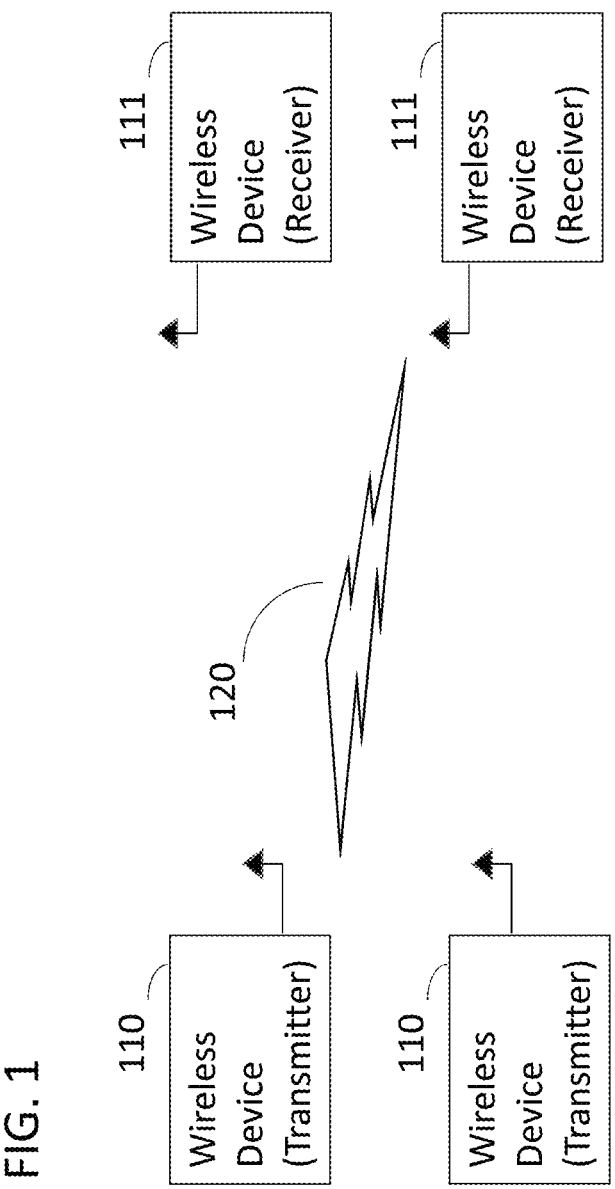
FIG. 1 illustrates an exemplary wireless network for providing services to wireless devices in accordance with an exemplary aspect of the present disclosure.

The present disclosure relates to improving a speed of a turbo decoder of a receiver wireless device that decodes a received code to retrieve information bits that are encoded by a turbo encoder of a transmitter wireless device. For example, in one aspect, the speed of the turbo decoder may be improved by retrieving more than one sample of data in a given cycle of a clock signal, and/or processing the retrieved samples in parallel.

As described above, turbo coding may improve coding efficiency. In turbo decoding, the information and parity bits are encoded using two recursive systematic encoders. The two encoders operate on different orderings of the same information bits. The encoded bits are then processed by a digital baseband processor and a Radio Frequency (RF) front end processor. Then, the RF signal is transmitted via one or more antennas. The processing by the digital baseband processor may comprise: interleaving, ciphering, data segmenting, Digital-to-Analog converting, and the like. The processing by the RF front end processor may comprise: RF up-converting, power amplifying, duplexing, and the like. Similarly, a receiver wireless device performs the reverse of the operations performed by the transmitter wireless device to retrieve the information bits. However, wireless transmission is not likely to be error free. As such, the turbo decoding to retrieve the information bits includes correcting errors that occur during transmission.

In turbo decoding, the error correction involves an iterative approach in which a decision as to whether a decoded data segment is correct is made after each iteration or after multiple iterations. Note that each segment includes Cyclic Redundancy Check (CRC) bits along with the information and parity bits. Hence, the turbo decoder may re-compute the CRC bits on the information bits and compare the computed CRC bit against the CRC bits received from the transmitter wireless device (i.e., the CRC bits included in the segment being decoded). If the comparison of the computed CRC bits against the CRC bits received from the transmitter indicates that the decoded segment is not accurate and a maximum number of iterations is not reached, the iteration continues. When the decoded segment is deemed accurate or the maximum number of iterations is reached, the decoded segment is provided as an output of the turbo decoder. For example, the decoded segment may be provided to an application layer, e.g., a video, image, data, voice application.

The decoding may require several iterations. Therefore, the decision as to whether a decoded data segment is correct may be made after each iteration or after multiple iterations. The turbo decoding may take a significant length of time and the speed of the turbo decoder may impact applications, e.g., video applications, gaming applications, and the like. As such, improving the speed of the turbo decoder is advantageous.

The present disclosure describes a method for improving the speed of a decoder and a device comprising one or more instances of a MAP turbo decoder. A reduction in decoding latency is achieved by increasing a number of computations that are performed in parallel while turbo decoding. In other words, the one or more instances of the MAP turbo decoder enable a receiver of a wireless device to support high data rate applications.

FIG. 1 illustrates an exemplary wireless network 100 for providing services to wireless devices in accordance with an exemplary aspect of the present disclosure. The wireless network comprises transmitter wireless devices 110 and receiver wireless devices 111 communicating over a wireless channel 120. For example, the wireless device 110 or 111 may be a user equipment. In addition, the wireless device may be a base station. It is noted that the antennas of the wireless devices 110 and 111 may be antennas of a transceiver that may be used for both transmitting and receiving of a wireless signal. As such, each wireless device may be a device for transmitting or receiving the wireless signal, based on whether a Radio Frequency (RF) signal is transmitted or received by the device.

A receiver of a wireless device 111, includes several components. For example, the transmitter may include one or more of: an antenna, a duplexer, a bandpass filter, an amplifier, an RF down converter, a demodulator, a baseband pre-processor (e.g., for data concatenation, deciphering, de-interleaving, etc.), a turbo decoder (e.g., for decoding information bits for a channel), a digital-to-analog converter, etc.

Figure 2:
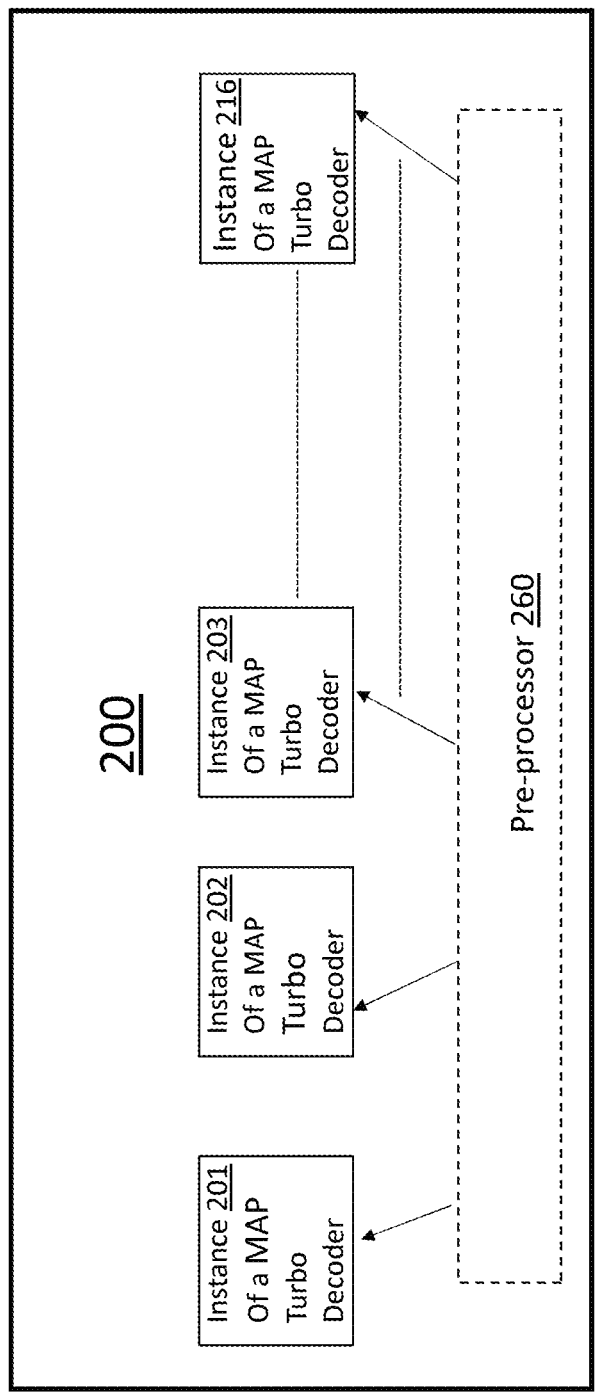
FIG. 2 illustrates instances of a Maximum-A-Posteriori (MAP) turbo decoder for decoding a segment of a received code in accordance with an exemplary aspect of the present disclosure.

FIG. 2 illustrates instances of a MAP turbo decoder 200 for decoding a segment of a received code in accordance with an exemplary aspect of the present disclosure. The one or more instances of a MAP turbo decoder 200 are operable to receive a signal, e.g., a signal transmitted over a wireless channel. In one aspect, the wireless channel may comprise a channel of an LTE network.

The one or more instances of a MAP turbo decoder 200 are comprised within each receiver wireless device 111 described above with respect to FIG. 1. The turbo decoder of the present disclosure decodes by applying a Maximum-a-Posteriori (MAP) turbo decoding algorithm. For clarity, the "MAP turbo decoder" may simply be referred to as the "decoder" or the "MAP decoder".

In one aspect, the instances of a MAP turbo decoder 200, described above, may include any number of instances, with each instance being for decoding a segment of a received code. For instance, suppose the received code comprises 16 segments. Then, the one or more instances of a MAP turbo decoder 200 may comprise instances 201 through 216, with each instance of the instances 201-216 being for decoding one of the 16 segments.

The MAP turbo decoding algorithm of the present disclosure is an iterative decoding algorithm that is based on an assessment of whether there is a need for a further iteration. The assessment is based on an accuracy of a decoded segment. In one example, whether the segment is decoded correctly may be determined after each iteration. In another example, whether the segment is decoded correctly may be determined after multiple iterations, e.g., every two iterations. Then, the operation continues to a next iteration until either the decoded segment is deemed accurate or a maximum number of iterations is reached. The decoded segment is provided as an output when the operation is deemed accurate or the maximum number of iterations reached.

In one aspect, for each segment, the MAP turbo decoding algorithm is applied using a fixed window size. In one aspect, the window size is set to a default value. In one aspect, the default value for the window size comprises 64 bits. Depending on the size of the segment and the window size, a segment may comprise one or more windows. For example, suppose the segment is 64 bits and the window size is also 64 bits. Then, the segment is said to be of a single window. Note that the size of the segment may or may not be a multiple of the window size. When the size of the segment is not a multiple of the window size, the remainder of the sizes of the MAP and the window may be set as the window size of the last window of the MAP. For example, for a given instance of a MAP decoder, the remainder of the size of the segment divided by the window size may be computed. Then, the computed remainder may be used as the window size for the last window of the MAP. For instance, suppose the size of the MAP is 130 bits and the window size is 64 bits. Then, the segment may be divided into three windows: a first window of 64 bits, a second window of 64 bits, and a third window of 2 bits.

Returning to FIG. 2, in one aspect, the one or more instances of a MAP turbo decoder are coupled to a pre-processor 260 configured, for each instance, to generate the segment and to subdivide the generated segment into the windows. For example, the instances 201-216 of the MAP turbo decoder may be coupled to the pre-processor 260 that is configured to, for each of the instances 201-216, generate the segment and subdivide the generated segment into respective windows of the segment. Each window of a segment comprises a pre-determined number of systematic and parity bits, and the systematic bits comprise information and Cyclic Redundancy Check (CRC) bits. For an illustrative example, suppose the segment size is 128 bits and the window size is 64 bits. Then, the received code includes systematic and parity bits. The received code is subdivided into segments that include 128 systematic and 128 parity bits. The 128 systematic bits include information and CRC bits. For instance, the 128 systematic bits may comprise 104 information bits and 24 CRC bits. Each segment is then divided into two windows for processing.

Figure 3:
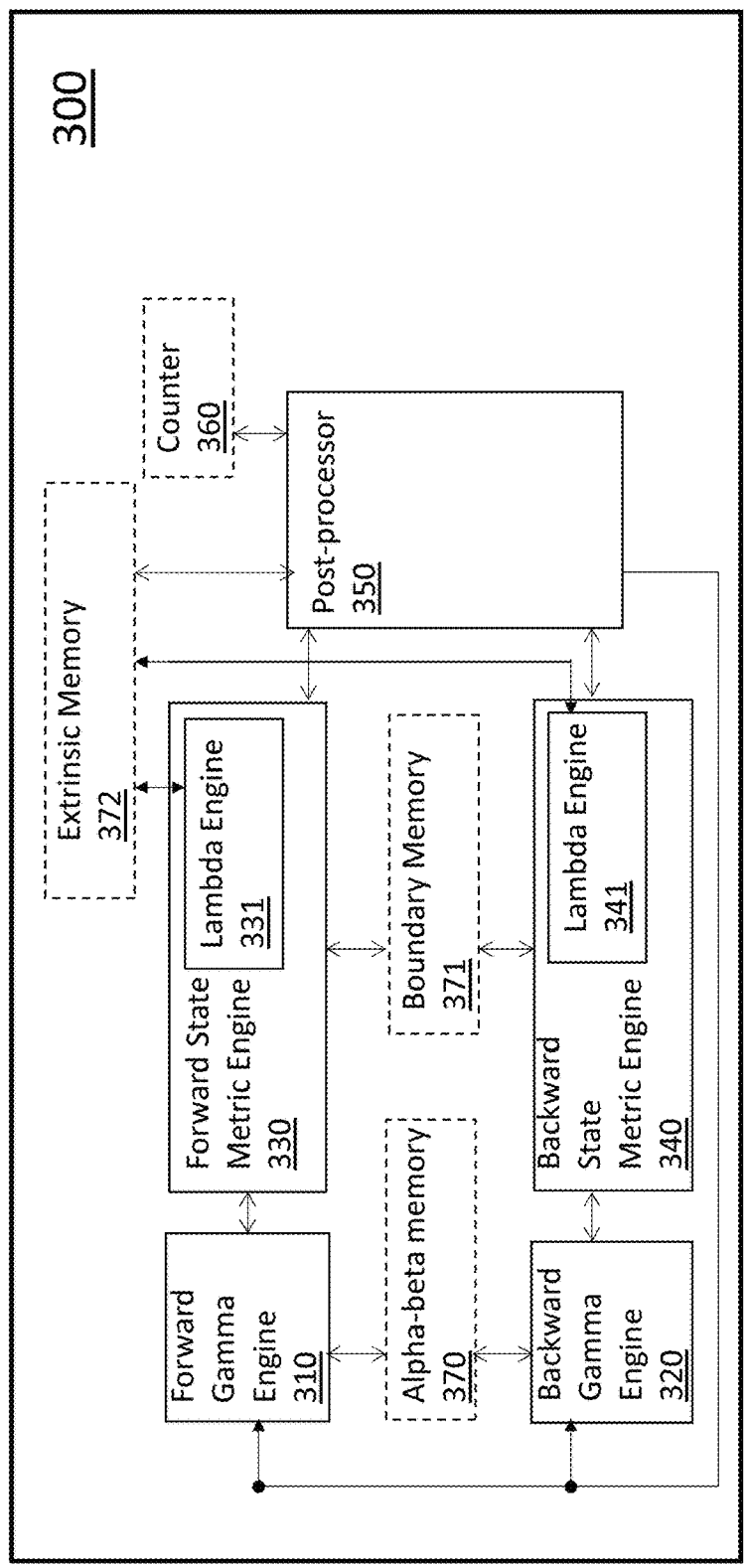
FIG. 3 illustrates an instance of the MAP turbo decoder in accordance with an exemplary aspect of the present disclosure.

FIG. 3 illustrates an instance 300 of the one or more instances of the MAP turbo decoder in accordance with an exemplary aspect of the present disclosure. For example, the instance 300 may represent any of the instances 201-216. The MAP turbo decoder 300 comprises: a forward gamma engine 310, a backward gamma engine 320, a forward state metric engine 330, a backward state metric engine 340, a lambda engine 331 associated with the forward state metric engine 330, a lambda engine 341 associated with the backward state metric engine 340, a post-processor 350, and an optional counter 360.

In one aspect, the forward state metric engine 330 comprises the lambda engine 331. In one aspect, the lambda engine 331 is external to the forward state metric engine 330, and is communicatively coupled to the forward state metric engine 330. In one aspect, the backward state metric engine 340 comprises the lambda engine 341. In one aspect, the lambda engine 341 is external to the backward state metric engine 340, and is communicatively coupled to the backward state metric engine 340.

In one aspect, the MAP turbo decoder 300 further comprises: an alpha-beta memory 370, a boundary memory 371, and an extrinsic memory 372.

The forward gamma engine 310 is configured to compute, for each window, gamma branch metrics in a forward direction. The backward gamma engine 320 is configured to compute, for each window, gamma branch metrics in a backward direction. In one aspect, the gamma branch metrics in the forward and backward directions are computed concurrently. In one aspect, the gamma branch metrics in the forward and backward directions are computed based on received bits, a combination of transmitted bits, and a-priori information for the received bits.

In one aspect, the transmitted bits comprise systematic and parity bit outputs of a transmitter. In one aspect, the received bits comprise soft bits representing a received channel symbol of the systematic and parity outputs. For example, the soft bits representing the received channel symbol may be determined by a demodulator of the receiver.

It is noted that the parity bits are used for computation of the gamma branch metrics in both the forward and backward directions for all iterations. For example, the gamma branch metrics are recomputed for each iteration, rather than being stored in memory and retrieved for a next iteration.

In one aspect, for iterations other than the first iteration, the a-priori information for the received bits comprises information received from a previous iteration. For the first iteration, the contribution to the gamma branch metric computations from a-priori information is assumed to be zero. For subsequent iterations, the a-priori information for the received bit is updated based on the extrinsic data of the previous iteration. Thus, for subsequent iterations, at least some portion of the a-priori information is based on the extrinsic data of a previous iteration. Then, the gamma branch metrics are computed based on the updated a-priori information. In other words, extrinsic data are computed such that the data may be used for updating the a-priori information of subsequent iterations, thereby updating the gamma branch metrics of the subsequent iterations.

As described above, the segments are subdivided into windows by the pre-processor 260. The pre-processor 260 stores the pre-processed bits in memory such that the turbo decoder can sequentially retrieve samples from the memory for processing. Then, the forward gamma engine 310 and the backward gamma engine 320 may compute the respective gamma branch metrics for each segment by sequentially processing each window.

In one aspect of the present disclosure, in order to advantageously increase the speed of the turbo decoder, in each cycles of a timing signal, two samples of a window are processed simultaneously. In other words, during each cycle of the timing signal, samples of the received bits comprising two systematic and two parity bits are processed.

As described above, the gamma branch metrics in the forward and backward directions are concurrently computed. In one aspect, the concurrently computing the gamma branch metrics in the forward and backward directions comprises: in each cycle of the timing signal, concurrently computing one gamma branch metric in the forward direction and one gamma branch metric in the backward direction, until the forward and backward gamma branch metrics are computed for each bit of each window of the segment. In other words, the concurrent computation of the gamma branch metrics in the forward and backward directions is performed by simultaneously computing two gamma branch metrics in each cycle of the timing signal, one gamma branch metrics being in the forward direction and another gamma branch metrics being in the backward direction.

As described above, two systematic and two parity bits are processed during each cycle of the timing signal. In one aspect, for each cycle of the timing signal, the gamma branch metric in the forward direction is computed based on a first systematic bit of the two received systematic bits and a first parity bit of the two received parity bits, and the gamma branch metric in the backward direction is computed based on a second systematic bit of the two received systematic bits and a second parity bit of the two received parity bits.

The forward state metric engine 330 is coupled to the forward gamma engine 310, and is configured, for each window, to compute a forward state metric based on the gamma branch metric computed by the forward gamma engine 310 and a first initial value. The backward state metric engine 340 is coupled to the backward gamma engine 320, and is configured, for each window, to compute a backward state metric based on the gamma branch metric computed by the backward gamma engine 320 and a second initial value. In one aspect, the forward and the backward state metrics are computed sequentially. In another aspect, the forward and a backward state metrics are computed concurrently. For example, the forward and backward state metrics may be computed sequentially and concurrently. The setting of the first and second initial values is described below in relation to an initialization operation.

In order to facilitate the sequential computations, results of computations are stored in memory and retrieved when needed. For ease of understanding, the usage of the various memory locations is first described below.

In one aspect, the alpha-beta memory 370 is coupled to the forward state metric engine 330 and to the backward state metric engine 340, and is configured to store values of the forward and backward state metrics during computations. In one aspect, up to a windows worth of values of alpha and beta are stored in the alpha-beta memory 370 during computation of the forward state metrics, and the stored values of alpha and beta are provided to the backward state metric engine 340, in a reverse order, when the backward state metrics is being computed.

In one aspect, the boundary memory 371 is coupled to the forward state metric engine 330 and to the backward state metric engine 340, and is configured to store values of the forward and backward state metrics at boundaries of windows and at boundaries of the instances of the MAP turbo decoder.

In one aspect, the extrinsic memory 372 is coupled to the post-processor 350, the forward gamma engine 310, and the backward gamma engine 320, and is configured to store the extrinsic data.

Returning to the sequential computation, in one aspect, the forward state metric engine comprises an alpha engine and the backward state metric engine comprises a beta engine. In one aspect, when the forward state metric engine comprises an alpha engine, the forward state metrics of the segment is computed sequentially in an increasing bit order, and the backward state metrics of the segment is computed sequentially from a first window of the segment to a last window of the segment, the backward state metrics of a given window being computed in a decreasing bit order.

In one aspect, the forward state metric engine comprises a beta engine and the backward state metric engine comprises an alpha engine. In one aspect, when the forward state engine comprises a beta engine, the forward state metrics of the segment is computed sequentially in a decreasing bit order, and the backward state metrics of the segment is computed sequentially from a last window of the segment to a first window of the segment, the backward state metrics of a given window being computed in an increasing bit order.

In one aspect, the computing of the forward and backward state metrics comprises: concurrently initializing the forward state metric engine based on the first initial value and the backward state metric engine based on the second initial value in a same cycle of a timing signal, and concurrently and sequentially computing, in each subsequent cycle of the timing signal, one forward and one backward state metrics, until the forward and backward state metrics are computed for each bit of each window of the segment.

In one aspect, a controller of the instances of the MAP turbo decoder initializes the forward and backward state metric engines. In one aspect, the initializing is based on whether the first iteration is for a forward state metric engine that comprises an alpha engine or for a forward state metric engine that comprises a beta engine. In other words, the initialization is based on whether the first iteration is an alpha forward iteration or a beta forward iteration. Then, the controller determines whether or not the iteration is a first iteration.

In one aspect, when the iteration is determined as being for the first iteration and the forward state metric engine comprises an alpha engine, a first instance of the one or more instances of the MAP turbo decoder is initialized with a maximum value, and each instance other than the first is initialized with a value of zero. In one aspect, when the iteration is determined as being for the first iteration and the forward state metric engine comprises a beta engine, a last instance of the one or more instances of the MAP turbo decoder is initialized in accordance with a tailbits-calculated initial value, and each instance other than the last instance is initialized with a value of zero.

In one aspect, for an iteration other than for the first iteration, the initializing comprises setting values of alpha and beta in accordance with respective values of alpha and beta stored in boundary memories during a previous iteration. In other words, the first and second initial values are derived from values of alpha and beta stored in a boundary memory in a previous iteration. For example, suppose the forward state metric engine comprises an alpha engine. Then, the first initial value is an alpha value and the second initial value is a beta value, the alpha and beta values being values stored in a boundary memory in a previous iteration. In another example, suppose the forward state metric engine comprises a beta engine. Then, the first initial value is a beta value and the second initial value is an alpha value. As such, the computation of the forward state metrics is based on the initialized forward state metric engine and the gamma branch metrics in the forward direction. Similarly, the computation of the backward state metrics is based on the initialized backward state metric engine and the gamma branch metrics in the backward direction.

In one aspect, the forward state metric is computed in a same cycle of a timing signal during which the gamma branch metric in the forward direction is computed, and the backward state metric is computed in a same cycle of a timing signal during which the gamma branch metric in the backward direction is computed.

The lambda engines 331 and 341 are associated with the forward state metric engine 330 and the backward state metric engine 340, respectively, and are configured to determine Log Likelihood Ratios (LLRs), and soft decisions. In one aspect, the LLRs are computed for received and decoded bits. Then, for each received bit, a soft decision is made based on the computed LLR. In one aspect, the LLR is computed using a Max-Log MAP algorithm. An exemplary Max-Log MAP turbo decoding algorithm is described in Section A.

In one aspect, for each received bit, the LLR is computed in a cycle of the timing signal immediately following the cycle in which a later of the forward and the backward state metric is computed.

In one aspect, for each received bit, the LLR is determined based on: the computed forward and backward state metrics of the received bit, the computed gamma branch metric of the received bit in the forward direction, and the computed gamma branch metric of the received bit in the backward direction.

The post-processor 350 is coupled to the forward state metric engine 330 and the backward state metric engine 340, and configured to compute extrinsic data based on the forward and backward state metrics for any subsequent iteration as at least a portion of the a-priori information, and to otherwise provide a decoded segment.

In one aspect, the optional counter 360 is coupled to the post-processor 350 and configured to count a number of iterations for decoding of the segment. If the decoded segment is deemed as being inaccurate, the extrinsic data is used by the gamma engines 310 and 320 for updating the a-priori information and re-computing the gammas in the forward and backward directions.

In one aspect, the decoded segment is provided as an output of the decoder when either the decoded segment is deemed accurate or the maximum number of iterations is reached for decoding the segment. For the example described above, after soft decisions are available for the 128 systematic bits (i.e., for both windows), the post-processor 350 may compute the CRC on the information bits (i.e., the 104 decoded bits). Then, the computed CRC is compared to the 24 remaining decoded bits. Based on the comparison of the computed and received CRCs, a determination is made as to the accuracy of the decoded segment. If the computed and received CRCs match, the decoded segment is deemed accurate. If the decoded segment is deemed accurate or a maximum number of iterations is reached, a hard-decision is made for the segment and the decoded segment is provided as an output of the instance of the MAP turbo decoder. In contrast, if the CRCs do not match, the decoded segment is deemed inaccurate.

In one aspect, when the decoded segment is deemed inaccurate and a maximum number of iterations is not reached, the counter is incremented and the process continues to a next iteration. When the decoded segment is deemed inaccurate and a maximum number of iterations is not reached, the extrinsic data is used to update the a-priori information for the next iteration. For example, during the next iteration, the extrinsic data is used to update the a-priori information, and the gamma branch metrics, the forward and backward state metrics, etc. are re-computed using the updated a-priori information, i.e., newest extrinsic data.

In one aspect, the decoded segment may be provided when the accuracy of the decoded segment reached a predetermined threshold. For example, the CRCs may not match completely but the difference between the CRCs may be acceptable. For example, suppose there are only a limited number of coded that may be transmitted by a transmitter towards the receiver. Then, the receiver may be able to identify which one of the possible codes was transmitted if the difference between the computed and received CRCs is small enough.

In one aspect, for a given bit, the extrinsic data is computed in a cycle of a timing signal following a cycle of the timing signal during which a later of the forward and the backward state metric is computed.

Figure 4:
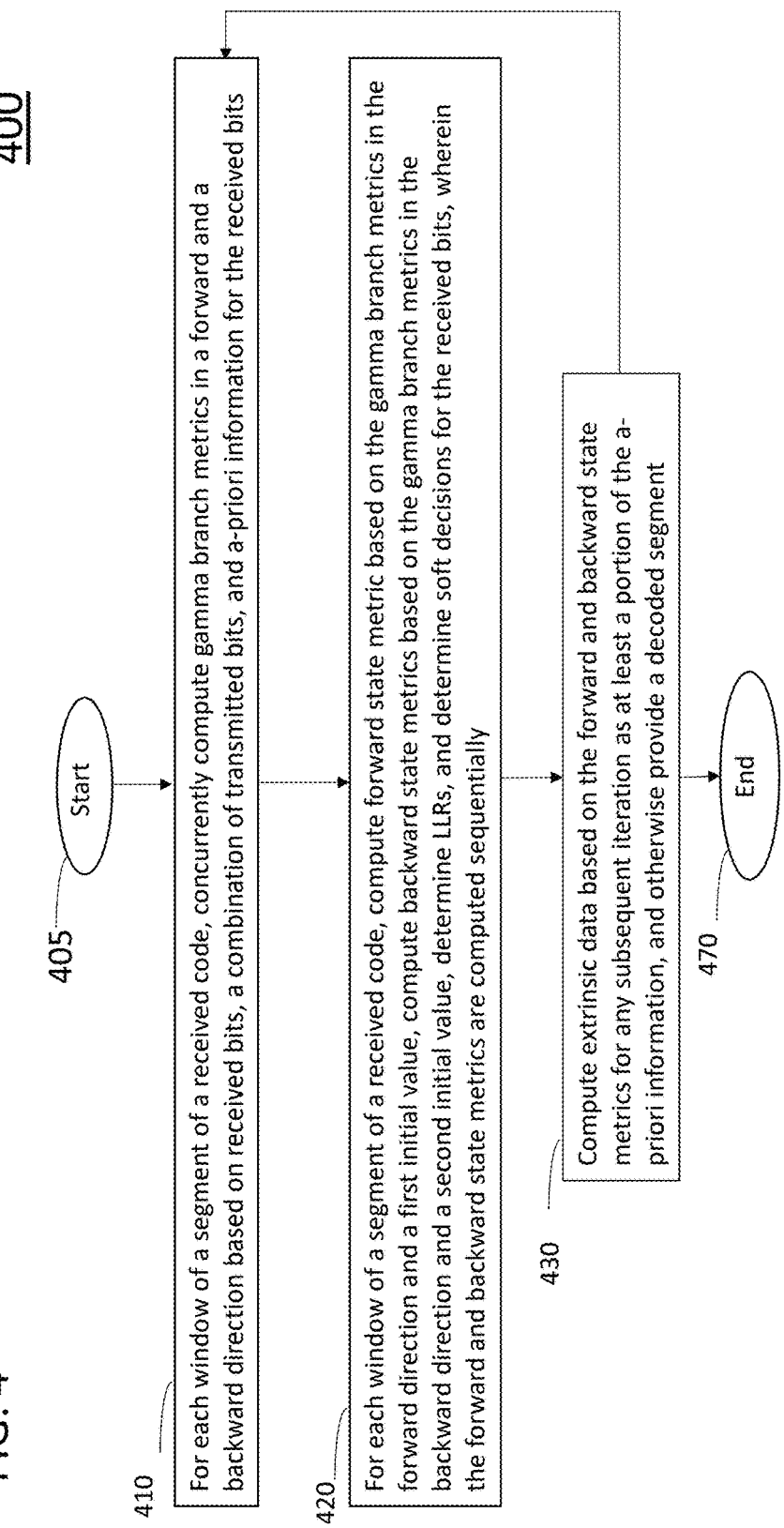
FIG. 4 illustrates a flowchart of an example method for decoding a segment of a received code in accordance with an exemplary aspect of the present disclosure.

FIG. 4 illustrates a flowchart of an example method 400 for decoding a received code in accordance with an exemplary aspect of the present disclosure. The operations of the method are not limited to the order described below, and the various operations may be performed in a different order. Further, two or more operations of the method may be performed simultaneously with each other.

In one aspect of the present disclosure, the method 400 may be implemented in a wireless device that comprises one or more antennas configured to receive a wireless signal and one or more instances of a decoder, e.g., instances 201-216. For example, a signal may be received over the wireless channel using a wireless device that comprises the one or more instances of the MAP decoder. The method 400 may be implemented in an instance 300 of a MAP turbo decoder of the one or more instances 200. Each instance 300 is for decoding a segment of the received code, the segment being subdivided into windows, wherein, for each window of the segment, the concurrent computations of the gamma branch metrics in a forward and a backward directions are performed by forward and backward gamma engines 310 and 320, respectively, based on received bits, a combination of transmitted bits, and a-priori information for the received bits, the sequential computations of the forward and backward state metrics are performed by forward and a backward state metric engines 330 and 340 comprising respective lambda engines 331 and 341 and coupled to the respective forward and backward gamma engines 310 and 320, the determinations of the Log Likelihood Ratios (LLRs) and the determinations of the soft decisions for the received bits are performed by the lambda engines 331 and 341, the forward and backward state metrics being based on respective initial values and the concurrently computed respective gamma branch metrics by the respective forward and backward gamma engines 310 and 320, and the computations of extrinsic data based on the forward and backward state metrics for any subsequent iteration as at least a portion of the a-priori information and the otherwise providing of the decoded segment are performed by the post-processor 350, as described above. In another example, the method 400 may be implemented in a device 500, described below. For each segment of the received code, the method 400 starts at operation 405 and proceeds to operation 410.

At operation 410, the method: for each window, computes, by forward gamma engine 310, gamma branch metrics in a forward direction, computes, by backward gamma engine 320, gamma branch metrics in a backward direction, wherein the gamma branch metrics are based on received bits, a combination of transmitted bits, and a-priori information for the received bits, and the gamma branch metrics in the forward and backward directions are computed concurrently.

At operation 420, the method: for each window, sequentially computes, by forward state metric engine 330, forward state metrics based on the gamma branch metrics in the forward direction and a first initial value, sequentially computes, by backward state metric engine 340, backward state metrics based on the gamma branch metrics in the backward direction and a second initial value, and determines LLRs and soft decisions for the received bits, by lambda engines 331 and 341, wherein the lambda engines 331 and 341 are associated with the forward and backward state metric engines 330 and 340, respectively.

At operation 430, the method, by a post-processor 350, computes extrinsic data based on the forward and backward state metrics for any subsequent iteration as at least a portion of the a-priori information or provides a decoded segment.

The method may then proceed to operation 470 to end receiving data or to operation 405 to receive and process coded data in accordance with the present disclosure.

Figure 5:
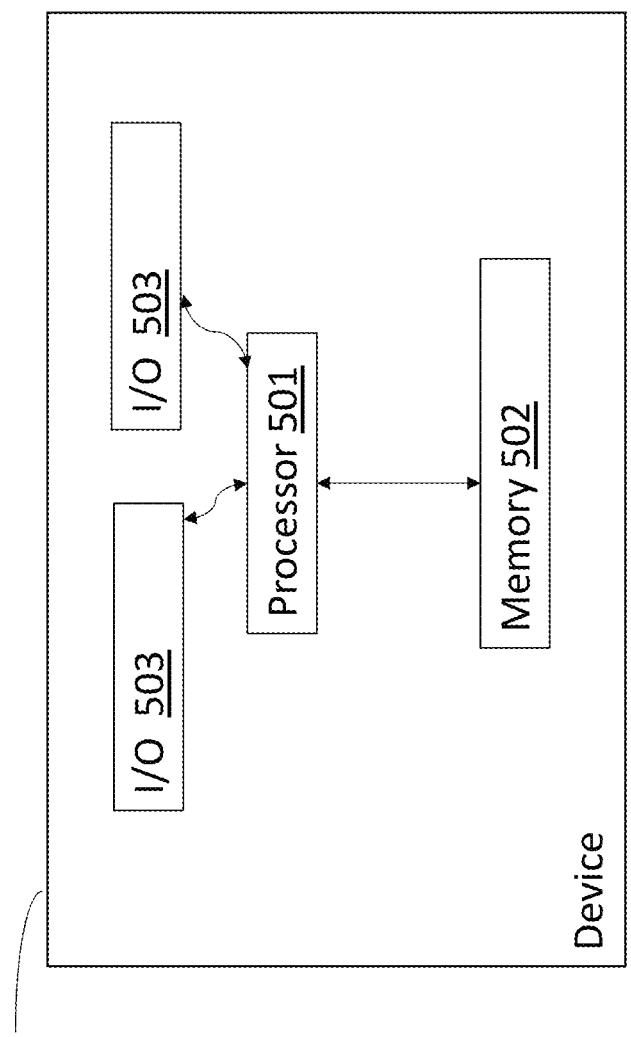
FIG. 5 illustrates a device for performing the decoding according to one or more exemplary aspects of the present disclosure.

FIG. 5 illustrates a device 500 for performing the functions (i.e., the decoding functions) according to one or more exemplary aspects of the present disclosure. The device 500 comprises a processor 501 and a memory 502 configured to store program instructions to be executed by the processor 501, where executing the program instructions causes the processor 501 to perform operations for receiving a signal over a wireless channel using a device comprising one or more instances of a Maximum-A-Posteriori (MAP) turbo decoder, each instance being for decoding a segment of a received code, the segment being subdivided into windows, the operations of an instance of the one or more instances of the decoder comprising: for each window, concurrently computing gamma branch metrics in a forward and a backward direction, wherein the gamma branch metrics are based on received bits, a combination of transmitted bits, and a-priori information for the received bits; for each window, sequentially computing a forward and a backward state metric based on first and second initial values and based on the concurrently computed gamma branch metrics in the forward and the backward direction, respectively, determining Log Likelihood Ratios (LLRs), and determining soft decisions for received bits; and computing extrinsic data based on the forward and backward state metrics for any subsequent iteration as at least a portion of the a-priori information, and otherwise providing a decoded segment. The device 500 may further comprise any number and type of input/output devices 503.

It is noted that although FIG. 5 illustrates a single device, the method 400 may be implemented via any number of devices performing the operations of method 400 in a distributed manner, serial manner, or a combination thereof. In addition, the devices may be virtualized devices instantiated on servers (e.g., servers of a cloud network). As such, the representation of the hardware components of the device may be a virtualized or a physical representation, without departing from the teaching of the present disclosure. Accordingly, the method 400 may be implemented in hardware, software, or a combination thereof. It is noted that the processor 501 executing the program instructions includes the processor 501 performing the operations of the method 400 directly or indirectly. For example, the processor 501 may perform the operations in conjunction with other devices or may direct another device to perform the operations.

It should be understood that the aspects of the present disclosure are described above by way of examples. However, the various aspects are exemplary and not limitations. Thus, the scope of the present disclosure should not be construed as being limited by any of the above aspects or examples. The breadth and the scope of the present disclosure should be defined in accordance with the scope and breadth of the following claims and/or equivalents.

A. An Example of a MAP Decoding Algorithm

The exemplary decoding algorithm of the present disclosure is referred to as a Max-Log-MAP algorithm. The Max-Log-MAP algorithm is similar to a MAP algorithm and comprises a Quadratic Permutation Polynomial (QPP) interleaver. The QPP interleaver has advantageous characteristics. For example, odd and even memory indices are contention free. In addition, certain MAPs may be supported without contention. Moreover, when using the Max-Log-MAP algorithm, the forward and backward state metrics are computed in a logarithmic domain, and a max-star function is loosely approximated using:

$$\max{}^*(x,y) \approx \max(x,y) \qquad \text{Equation (1)}$$

Suppose a convolutional code has eight states. A state transition matrix may then be defined for transitions from a state S to a state S'. Suppose the states are numbered 0-7. Then, a transition may occur from state 0 to state 0, from state 0 to state 1, . . . , from state 7 to state 6, from state 7 to state 7.

Then, for a given information bit k, let $\gamma_k(S,S')$ represent a branch metric for a state transition from a state S to a state S', $\gamma_k(S',S)$ represent a branch metric for a state S given a state S', $\alpha_k(S)$ represent an alpha state metric, and $\beta_k(S)$ represent a beta state metric. It is noted that the branch metrics are also referred to as gamma metrics. Then, the branch metrics, the alpha state metric, and the beta state metric may be computed iteratively, as follows:

$$\gamma_k(S', S) = \frac{1}{2}[x_{s,k} * (a_k + y_{s,k}) + x_{p,x} * y_{p,k}], \qquad \text{Equation (2)}$$

-continued $$\alpha_k(S) = \max_{S'} {}^*(\alpha_{k-1}(S') + \gamma_k(S', S)), \text{ and} \qquad \text{Equation (3)}$$

$$\beta_k(S) = \max_{S'} {}^*(\beta_{k-1}(S') + \gamma_k(S', S)), \qquad \text{Equation (4)}$$

Wherein, $X_{s,k} \in (+1,-1)$ represents a systematic output of a transmitter for bit k;

$x_{p,k} \in (+1,-1)$ represents a parity output of a transmitter for bit k;

$y_{s,k}$ represents a soft bit representing a received channel symbol of the systematic output for bit k, for example, a soft decision made by the demodulator of the receiver;

$y_{p,k}$ represents a soft bit representing a received channel symbol of a parity output for bit k, for example a soft decision made for the parity bit by a demodulator of the receiver; and $\alpha_k$ represents a-priori information for bit k from a previous half iteration.

Note that the $y_{p,x}$ and $y_{s,k}$ are the soft bits as determined by the receiver. However, the receiver does not know the values of $x_{s,k}$ and $x_{p,k}$ that are originally transmitted by the transmitter. However, the receiver knows all the possible combinations of values of $x_{s,k}$ and $x_{p,k}$ that may be transmitted by the transmitter. For an illustrative example, suppose there are a total of four combinations of values of $x_{s,k}$ and that may be transmitted. For instance the four combinations may comprise: (1, 1), (1, −1), (−1, 1) and (−1, −1).

The Gamma may be computed based on the four combinations. For instance, four static values may be computed, with each static value being for a distinct one of the four different combinations (i.e., one of the four scenarios). In other words, in order to account for the different scenarios, the Gamma computation may be based on a combination of the transmitted bits. In one aspect, the four combinations may be given the same weight in computing the Gamma values. For instance, by substituting in Equation 2, four static Gamma values may be computed as follows:

$$\text{Based on } (1, 1) \rightarrow (a_k + y_{s,k} + y_{p,x})/2; \qquad \text{Equation (5)}$$

$$\text{Based on } (1, -1) \rightarrow (a_k + y_{s,k} - y_{p,x})/2;$$

$$\text{Based on } (-1, 1) \rightarrow (-a_k - y_{s,k} + y_{p,x})/2; \text{ and}$$

$$\text{Based on } (-1, -1) \rightarrow (-a_k - y_{s,k} - y_{p,x})/2.$$

Then, for the systematic bit k, an LLR, may be computed as:

$$LLR = \bigwedge_{k,s} = \max_{S' \rightarrow S, x=+1} {}^*(\alpha_{k-1}(S') + \gamma_k(S', S) + \beta_k(S)) - \qquad \text{Equation (6)}$$

$$\max_{S' \rightarrow S, x=-1} {}^*(\alpha_{k-1}(S') + \gamma_k(S', S) + \beta_k(S)).$$

The LLR provides a soft decision. Once, the soft decisions for the segment are completed, a CRC may be computed for the information bits. For example, suppose the systematic bits comprise 128 bits, with 104 bits being information bits and 24 bits being CRC bits. Then, the CRC is recomputed based on the 104 information bits. If the computed CRC matches the received CRC, the received segment is deemed as being accurately decoded. Then, the soft decision from the last even half iteration is output as a hard decision output. If the CRCs fail to match and the maximum number of iterations is not reached, the result of the soft decision is passed to the next half iteration. For example, the soft decision is used in Eqn. (1) for the next half iteration.

Once the soft or hard decision is made, an extrinsic systematic output, $e_k$, is computed as follows:

$$e_k = \Lambda_{k,x} - a_k - y_{s,k}. \qquad \text{Equation (7)}$$

In one aspect, a scaling factor is applied on $e_k$ before it is passed to the next half iteration.

Similarly, for the parity bit, the LLR may be computed as follows:

$$LLR \text{ for parity} \qquad \text{Equation (8)}$$

$$\text{bit} = \bigwedge_{k,p} = \max_{S' \rightarrow S, p=+1} {}^*(\alpha_{k-1}(S') + \gamma_k(S', S) + \beta_k(S)) -$$

$$\max_{S' \rightarrow S, p=-1} {}^*(\alpha_{k-1}(S') + \gamma_k(S', S) + \beta_k(S)).$$

In even half iterations, the LLR of parity bit 1 is computed. In odd half iterations, the LLR of parity bit 2 is computed.

Execution Example of a Turbo Decoding

Figure 6:
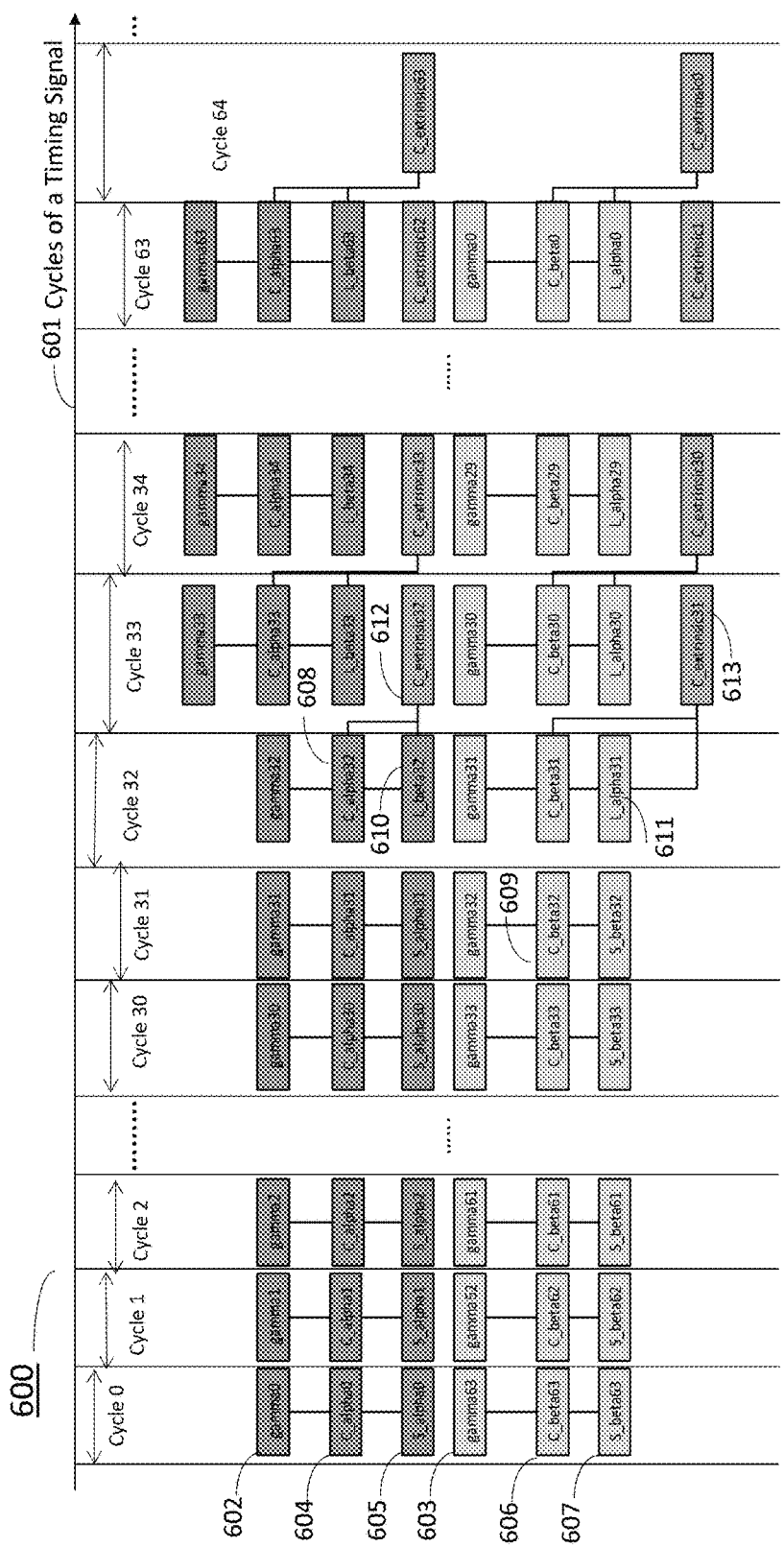
FIG. 6 illustrates an execution example of a turbo decoding in accordance with an exemplary aspects of the present disclosure.

FIG. 6 illustrates an execution example 600 of a turbo decoding in accordance with an exemplary aspect of the present disclosure. Example 600 illustrates the turbo decoding for one window in which the forward and backward gamma engines comprise an alpha engine and a beta engine, respectively. The window size is set to 64 bits.

Cycles of a timing signal 601 are sequential cycles during which computations are performed. Although the timing signal is continuous, for the non-limiting illustrative example, cycles 0-64 of the timing signal 601 are shown. For clarity, for each cycle of the timing signal 601, the terminologies described below are used to indicate: which computations are performed during the cycle, which results are stored in a memory location during the cycle, and/or which previously stored results are retrieved (i.e., loaded) from memory during the cycle.

The term "gamma" followed by a number indicates that the gamma having an index identified by the number is computed during the cycle. For example, terms "gamma0" and "gamma63" as shown in 602 and 603, respectively, illustrate that the gamma having an index of 0 and the gamma having an index of 63 are computed during cycle 0. Similarly, gamma1 and gamma62 are computed during cycle 1, gamma2 and gamma61 are computed during cycle 2, etc. The computed values of gamma are not stored and are computed each time an alpha or a beta needs to be computed (or recomputed).

The term "C_alpha" followed by a number indicates that the alpha having an index identified by the number is computed during the cycle. For example, the term "C_alpha0", as shown in 604, illustrates that the alpha having an index of 0 is computed during cycle 0. Similarly, alpha1 is computed during cycle 1, alpha2 is computed during cycle 2, etc.

The term "S_alpha" followed by a number indicates that the computed value of the alpha having the index identified by the number is stored in memory during the cycle. For example, the term "S_alpha0", as shown in 605, illustrates that alpha( ) computed during cycle 0 is stored in memory during the same cycle.

The term "C_beta" followed by a number indicates that the beta having an index identified by the number is computed during the cycle. For example, the term "C_beta63", as shown in 606, illustrates that beta having an index of 63 is computed during cycle 0. Similarly, beta62 is computed during cycle 1, beta61 is computed during cycle 2, etc.

The term "S_beta" followed by a number indicates that the computed value of the beta having the index identified by the number is stored in memory during the cycle. For example, the term "S_beta63", as shown in 607, illustrates that the value of beta63 computed during cycle 0 is stored in memory during the same cycle.

The term "L_beta" followed by a number indicates that the beta value having the index identified by the number is loaded (i.e., retrieved from memory) during the cycle. For example, the term "L_beta32", as shown in 610, illustrates that the value of beta32 computed during cycle 31 is retrieved from memory during cycle 32. Similarly, the value of beta33 is retrieved during cycle 33, the value of beta34 is retrieved during cycle 34, and so on.

The term "L_alpha" followed by a number indicates that the alpha having an index identified by the number is loaded (retrieved from memory) during the cycle. For example, the term "L_alpha31", as shown in 611, illustrates that alpha31 is retrieved from memory during cycle 32. Similarly, alpha30 is retrieved from memory during cycle 33, alpha29 is retrieved from memory during cycle 34, and so on.

The term "C_extrinsic" followed by a number indicates that the extrinsic having an index identified by the number is computed during the cycle. For example, the terms "C_extrinsic32" and "C_extrinsic31", as shown in 612 and 613, illustrate that extrinsic having indices of 32 and 31, respectively, are computed during cycle 33. Similarly, extrinsic33 and extrinsic30 are computed during cycle 34, extrinsic34 and extrinsic29 are computed during cycle 35, and so on. The extrinsic having indices 63 and 0 are computed during cycle 64.

As the example illustrates, during cycles 0-31 (i.e., the first 32 cycles), the forward gamma engine computes gamma0 through gamma31 and the backward gamma engine computes gamma63 through gamma32. The gamma computations in the forward and backward directions occur concurrently. In one aspect, the alpha and beta computations occur concurrently. For example, beta63 and alpha0 are computed in the same cycle, beta62 and alpha1 are computed in the same cycle, and so on.

During cycle 32, alpha32 is computed, as shown in 608. Note that beta32 is computed during cycle 31, as shown in 609. Therefore, cycle 32 is the first cycle during which a previously computed value having the same index may be retrieved from memory. Note also that the extrinsic outputs depends on both alpha and beta having the same index number. For example, extrinsic32 depends on alpha32 and beta32. Hence, the first extrinsic outputs are computed during cycle 33. However, in each subsequent cycle, two extrinsic outputs are computed. For example, extrinsic32 and extrinsic31 are computed during cycle 33, extrinsic33 and extrinsic30 are computed during cycle 34, and so on. Hence, when the gamma computations as well as the alpha and beta computations are performed concurrently, the extrinsic data may also be computed concurrently and the turbo decoder maximizes the number of parallel computations. The improvement in the number of parallel computations (i.e., the increase in the number of parallel computations) advantageously enables the turbo decoder to decode a segment in a shorter time.

It is noted that, after each iteration a decoded segment is evaluated to determine whether the decoding was accurate. For example, when the soft decisions are available for all systematic bits of a segment, the decoded segment may comprise the bits based on the soft decisions of the systematic bits. Then, a new CRC may be computed based on the information bits. If the new CRC matches the CRC received CRC, the decoded segment is deemed accurate. Then, a hard decision is made for the decoded segment. The hard-decision is provided as an output.

The following examples pertain to further embodiments.

Example 1 is one or more instances of a Maximum-A-Posteriori (MAP) turbo decoder for decoding a segment of a received code, the segment being subdivided into windows, an instance of the one or more instances of the MAP decoder comprising: forward and backward gamma engines configured to, for each window, concurrently compute gamma branch metrics in a forward and a backward direction, respectively, the gamma branch metrics being based on received bits, a combination of transmitted bits, and a-priori information for the received bits; forward and backward state metric engines comprising respective lambda engines and coupled to the respective gamma engines, and configured to, for each window, sequentially compute a forward and a backward state metric, respectively, based on a respective gamma branch metric and a respective initial value, the lambda engines being configured to determine Log Likelihood Ratios (LLRs) for received and decoded bits, and soft decisions for the received bits; and a post-processor coupled to the forward and backward state metric engines, and configured to compute extrinsic data based on the forward and backward state metrics for any subsequent iteration as at least a portion of the a-priori information, and to otherwise provide a decoded segment.

In Example 2, the subject matter of Example 1, wherein the forward and backward state metric engines are configured to compute the forward and the backward state metrics concurrently.

In Example 3, the subject matter of Example 1, wherein the received bits comprise systematic and parity bits, the LLRs are computed for the received and decoded bits, and the soft decisions are based on the LLRs.

In Example 4, the subject matter of Example 3, wherein for each received bit, the LLR is computed in a cycle of the timing signal immediately following the cycle in which a later of the forward or the backward state metric is computed for the received bit.

In Example 5, the subject matter of Example 3, wherein for each received bit, the LLR is based on the computed forward and backward state metrics of the received bit, the computed gamma branch metric of the received bit in a forward direction, and the computed gamma branch metric of the received bit in a backward direction.

In Example 6, the subject matter of Example 3, further comprising: a pre-processor coupled to the one or more instances of MAP turbo decoder, and configured to, for each of the one or more instances of the MAP turbo decoder, generate the segment, subdivide the generated segment into the windows, wherein each window comprises a pre-determined number of the systematic and parity bits, and the systematic bits comprise information and Cyclic Redundancy Check (CRC) bits.

In Example 7, the subject matter of Example 1, wherein for each received bit of each window of the segment, the extrinsic data is computed in a cycle of a timing signal following a cycle of the timing signal during which a later of the forward and the backward state metric is computed.

In Example 8, the subject matter of Example 1, wherein the forward state metric is computed in a same cycle of a timing signal during which the gamma branch metric in a forward direction is computed, and the backward state metric is computed in a same cycle of a timing signal during which the gamma branch metric in a backward direction is computed.

In Example 9, the subject matter of Example 1, further comprising a counter coupled to the post-processor and configured to count a number of iterations, wherein the a-priori information for the received bits is from a previous iteration, and the decoded segment is provided by: incrementing the counter and proceeding to a next iteration to re-compute the gamma branch metrics and the forward and backward state metrics, when the decoded segment based on the soft decisions is deemed inaccurate and a maximum number of iterations is not reached; and providing the decoded segment when either the decoded segment is deemed accurate or the maximum number of iterations is reached.

In Example 10, the subject matter of Example 1, wherein the received bits comprise two systematic and two parity bits per cycle of a timing signal, the gamma branch metric in a forward direction is computed based on a first systematic bit of the two systematic bits and a first parity bit of the two parity bits, and the gamma branch metric in a backward direction is computed based on a second systematic bit of the two systematic bits and a second parity bit of the two parity bits.

In Example 11, the subject matter of Example 10, wherein the gamma branch metrics in the forward and backward directions are computed concurrently by computing, in each cycle of the timing signal, one gamma branch metric in the forward direction and one gamma branch metric in the backward direction, until the gamma branch metrics in the forward and backward directions are computed for each bit of each window of the segment.

In Example 12, the subject matter of Example 2, wherein the computing of the forward and backward state metrics comprises: concurrently initializing the forward and backward state metric engines in a same cycle of a timing signal by setting the respective initial values based on values stored in a boundary memory; and concurrently and sequentially computing, in each subsequent cycle of the timing signal, one forward and one backward state metric until the forward and backward state metrics are computed for each bit of each window of the segment, wherein the forward state metrics is based on the initialized forward state metric engine and the gamma branch metrics in the forward direction, and the backward state metrics is based on the initialized backward state metric engine and the gamma branch metrics in the backward direction.

In Example 13, the subject matter of Example 12, wherein a controller of the instances of the MAP turbo decoder is configured to initialize the forward and backward state metric engines, the initializing comprising: determining whether the initializing is for a first iteration; when the iteration is determined as being for the first iteration and the forward state metric engine comprises an alpha engine, initializing a first instance of the one or more instances of the MAP turbo decoder with a maximum value, and initializing each instance other than the first with a value of zero; when the iteration is determined as being for the first iteration and the forward state metric engine comprises a beta engine, initializing a last instance of the one or more instances of the MAP turbo decoder in accordance with a tailbits-calculated initial value, and initializing each instance other than the last instance with a value of zero; and when the iteration is determined as being for an iteration other than for the first iteration, initializing values of alpha and beta in accordance with respective values of alpha and beta stored in boundary memories during a previous iteration.

In Example 14, the subject matter of Example 1, wherein the forward state metric engine comprises an alpha engine and the backward state metric engine comprises a beta engine.

In Example 15, the subject matter of Example 14, wherein the forward state metrics of the segment is computed sequentially in an increasing bit order, the backward state metrics of the segment is computed sequentially from a first window of the segment to a last window of the segment, and the backward state metrics of a given window is computed in a decreasing bit order.

In Example 16, the subject matter of Example 1, wherein the forward state metric engine comprises a beta engine and the backward state metric engine comprises an alpha engine.

In Example 17, the subject matter of Example 16, wherein the forward state metrics of the segment is computed sequentially in a decreasing bit order, the backward state metrics of the segment is computed sequentially from a last window of the segment to a first window of the segment, and the backward state metrics of a given window is computed in an increasing bit order.

In Example 18, the subject matter of Example 1, further comprising: an alpha-beta memory coupled to the forward and backward state metric engines, and configured to store values of the forward and backward state metrics during computations; a boundary memory coupled to the forward and backward state metric engines, and configured to store values of the forward and backward state metrics at boundaries of windows and at boundaries of the instances of the MAP turbo decoder; and an extrinsic memory coupled to the post-processor, the forward gamma engine, and the backward gamma engine, and configured to store the extrinsic data.

In Example 19, the subject matter of Example 18, wherein up to a windows worth of values of alpha and beta are stored in the alpha-beta memory during computation of the forward state metrics, and the stored values of alpha and beta are provided to the backward state metric engine, in a reverse order, when the backward state metrics is being computed.

Example 20 is a wireless device, comprising: one or more antennas configured to receive a signal over a wireless channel comprising the received code; and the one or more instances of the MAP turbo decoder of claim 1, wherein the signal comprises the received code to be turbo decoded.

In Example 21, the subject matter of Example 20, wherein the forward and backward state metric engines are configured to compute the forward and the backward state metrics concurrently.

Example 22 is a method for decoding a segment of a received code by an instance of one or more instances of a Maximum-A-Posteriori (MAP) turbo decoder, the segment being subdivided into windows, the method comprising: for each window, concurrently computing, by forward and backward gamma engines respectively, gamma branch metrics in a forward and a backward direction, wherein the gamma branch metrics are based on received bits, a combination of transmitted bits, and a-priori information for the received bits; for each window, sequentially computing, by forward and backward state metric engines comprising respective lambda engines and coupled to the respective forward and backward gamma engines, a forward and a backward state metric, respectively, and determining, by the lambda engines, Log Likelihood Ratios (LLRs) for received and decoded bits, and soft decisions for the received bits, wherein the forward and the backward state metrics are based on a respective gamma branch metric and a respective initial value; and computing, by a post-processor, extrinsic data based on the forward and backward state metrics, and providing a decoded segment.

In Example 23, the subject matter of Example 22, wherein the forward and the backward state metrics are computed concurrently.

Example 24 is a device, comprising: a processor; and a memory configured to store a program instructions to be executed by the processor, where executing the program instructions causes the processor to perform operations for receiving a signal over a wireless channel and decoding a segment of a received code by an instance of one or more instances of a Maximum-A-Posteriori (MAP) turbo decoder, the segment being subdivided into windows, the operations comprising: concurrently computing, for each window, gamma branch metrics in a forward and a backward direction, wherein the gamma branch metrics are based on received bits, a combination of transmitted bits, and a-priori information for the received bits; sequentially computing, for each window, a forward and a backward state metric and determining Log Likelihood Ratios (LLRs) for received and decoded bits, and soft decisions for the received bits, wherein the forward and the backward state metrics are based on a respective gamma branch metric and a respective initial value; and computing extrinsic data based on the forward and backward state metrics, and providing a decoded segment.

In Example 25, the subject matter of Example 24, wherein the forward and the backward state metrics are computed concurrently.

Example 26 is one or more instances of a Maximum-A-Posteriori (MAP) turbo decoder for decoding a segment of a received code, the segment being subdivided into windows, an instance of the one or more instances of the MAP decoder comprising: forward and backward gamma engine means for, for each window, concurrently computing gamma branch metrics in a forward and a backward direction, respectively, the gamma branch metrics being based on received bits, a combination of transmitted bits, and a-priori information for the received bits; forward and backward state metric engine means comprising respective lambda engine means and coupled to the respective gamma engines, and for, for each window, sequentially computing a forward and a backward state metric, respectively, based on a respective gamma branch metric and a respective initial value, the lambda engines being configured to determine Log Likelihood Ratios (LLRs) for received and decoded bits, and soft decisions for the received bits; and a post-processing means coupled to the forward and backward state metric engines, and for computing extrinsic data based on the forward and backward state metrics for any subsequent iteration as at least a portion of the a-priori information, and otherwise providing a decoded segment.

In Example 27, the subject matter of Example 26, wherein the forward and backward state metric engine means are for computing the forward and the backward state metrics concurrently.

In Example 28, the subject matter of Example 26, wherein the received bits comprise systematic and parity bits, the LLRs are computed for the received and decoded bits, and the soft decisions are based on the LLRs.

In Example 29, the subject matter of Example 28, wherein for each received bit, the LLR is computed in a cycle of the timing signal immediately following the cycle in which a later of the forward or the backward state metric is computed for the received bit.

In Example 30, the subject matter of Example 28, wherein for each received bit, the LLR is based on the computed forward and backward state metrics of the received bit, the computed gamma branch metric of the received bit in a forward direction, and the computed gamma branch metric of the received bit in a backward direction.

In Example 31, the subject matter of Example 28, further comprising: a pre-processing means coupled to the one or more instances of MAP turbo decoder, and for, for each of the one or more instances of the MAP turbo decoder, generating the segment, subdividing the generated segment into the windows, wherein each window comprises a pre-determined number of the systematic and parity bits, and the systematic bits comprise information and Cyclic Redundancy Check (CRC) bits.

In Example 32, the subject matter of Example 26, wherein for each received bit of each window of the segment, the extrinsic data is computed in a cycle of a timing signal following a cycle of the timing signal during which a later of the forward and the backward state metric is computed.

In Example 33, the subject matter of Example 26, wherein the forward state metric is computed in a same cycle of a timing signal during which the gamma branch metric in a forward direction is computed, and the backward state metric is computed in a same cycle of a timing signal during which the gamma branch metric in a backward direction is computed.

In Example 34, the subject matter of any of Examples 26-33, further comprising a counting means coupled to the post-processor and for counting a number of iterations, wherein the a-priori information for the received bits is from a previous iteration, and the decoded segment is provided by: incrementing the counting means and proceeding to a next iteration to re-compute the gamma branch metrics and the forward and backward state metrics, when the decoded segment based on the soft decisions is deemed inaccurate and a maximum number of iterations is not reached; and providing the decoded segment when either the decoded segment is deemed accurate or the maximum number of iterations is reached.

In Example 35, the subject matter of any of Examples 26-33, wherein the received bits comprise two systematic and two parity bits per cycle of a timing signal, the gamma branch metric in a forward direction is computed based on a first systematic bit of the two systematic bits and a first parity bit of the two parity bits, and the gamma branch metric in a backward direction is computed based on a second systematic bit of the two systematic bits and a second parity bit of the two parity bits.

In Example 36, the subject matter of Example 35, wherein the gamma branch metrics in the forward and backward directions are computed concurrently by computing, in each cycle of the timing signal, one gamma branch metric in the forward direction and one gamma branch metric in the backward direction, until the gamma branch metrics in the forward and backward directions are computed for each bit of each window of the segment.

In Example 37, the subject matter of Example 27, wherein the computing of the forward and backward state metrics comprises: concurrently initializing the forward and backward state metric engine means in a same cycle of a timing signal by setting the respective initial values based on values stored in a boundary memory; and concurrently and sequentially computing, in each subsequent cycle of the timing signal, one forward and one backward state metric until the forward and backward state metrics are computed for each bit of each window of the segment, wherein the forward state metrics is based on the initialized forward state metric engine and the gamma branch metrics in the forward direction, and the backward state metrics is based on the initialized backward state metric engine and the gamma branch metrics in the backward direction.

In Example 38, the subject matter of Example 37, wherein a controller of the instances of the MAP turbo decoder is configured to initialize the forward and backward state metric engine means, the initializing comprising: determining whether the initializing is for a first iteration; when the iteration is determined as being for the first iteration and the forward state metric engine comprises an alpha engine, initializing a first instance of the one or more instances of the MAP turbo decoder with a maximum value, and initializing each instance other than the first with a value of zero; when the iteration is determined as being for the first iteration and the forward state metric engine comprises a beta engine, initializing a last instance of the one or more instances of the MAP turbo decoder in accordance with a tailbits-calculated initial value, and initializing each instance other than the last instance with a value of zero; and when the iteration is determined as being for an iteration other than for the first iteration, initializing values of alpha and beta in accordance with respective values of alpha and beta stored in boundary memories during a previous iteration.

In Example 39, the subject matter of any of Examples 26-33, wherein the forward state metric engine means comprises an alpha engine means and the backward state metric engine means comprises a beta engine means.

In Example 40, the subject matter of Example 39, wherein the forward state metrics of the segment is computed sequentially in an increasing bit order, the backward state metrics of the segment is computed sequentially from a first window of the segment to a last window of the segment, and the backward state metrics of a given window is computed in a decreasing bit order.

In Example 41, the subject matter of any of Examples 26-33, wherein the forward state metric engine means comprises a beta engine means and the backward state metric engine means comprises an alpha engine means.

In Example 42, the subject matter of Example 41, wherein the forward state metrics of the segment is computed sequentially in a decreasing bit order, the backward state metrics of the segment is computed sequentially from a last window of the segment to a first window of the segment, and the backward state metrics of a given window is computed in an increasing bit order.

In Example 43, the subject matter of any of Examples 26-33, further comprising: an alpha-beta memory means coupled to the forward and backward state metric engines, and for storing values of the forward and backward state metrics during computations; a boundary memory means coupled to the forward and backward state metric engines, and for storing values of the forward and backward state metrics at boundaries of windows and at boundaries of the instances of the MAP turbo decoder; and an extrinsic memory means coupled to the post-processor, the forward gamma engine means, and the backward gamma engine means, and fir storing the extrinsic data.

In Example 44, the subject matter of Example 43, wherein up to a windows worth of values of alpha and beta are stored in the alpha-beta memory means during computation of the forward state metrics, and the stored values of alpha and beta are provided to the backward state metric engine means, in a reverse order, when the backward state metrics is being computed.

What is claimed is:

1. One or more instances of a Maximum-A-Posteriori (MAP) turbo decoder for decoding a segment of a received code, the segment being subdivided into windows, an instance of the one or more instances of the MAP decoder comprising:
   forward and backward gamma engines configured to, for each window, concurrently compute gamma branch metrics in a forward and a backward direction, respectively, the gamma branch metrics being based on received bits, a combination of transmitted bits, and a-priori information for the received bits;
   forward and backward state metric engines comprising respective lambda engines and coupled to the respective gamma engines, and configured to, for each window, sequentially compute a forward and a backward state metric, respectively, based on a respective gamma branch metric and a respective initial value, the lambda engines being configured to determine Log Likelihood Ratios (LLRs) for received and decoded bits, and soft decisions for the received bits; and
   a post-processor coupled to the forward and backward state metric engines, and configured to compute extrinsic data based on the forward and backward state metrics for any subsequent iteration as at least a portion of the a-priori information, and to otherwise provide a decoded segment.

2. The one or more instances of the MAP turbo decoder of claim 1, wherein the forward and backward state metric engines are configured to compute the forward and the backward state metrics concurrently.

3. The one or more instances of the MAP turbo decoder of claim 1, wherein the received bits comprise systematic and parity bits, the LLRs are computed for the received and decoded bits, and the soft decisions are based on the LLRs.

4. The one or more instances of the MAP turbo decoder of claim 3, wherein for each received bit, the LLR is computed in a cycle of the timing signal immediately following the cycle in which a later of the forward or the backward state metric is computed for the received bit.

5. The one or more instances of the MAP turbo decoder of claim 3, wherein for each received bit, the LLR is based on the computed forward and backward state metrics of the received bit, the computed gamma branch metric of the received bit in a forward direction, and the computed gamma branch metric of the received bit in a backward direction.

6. The one or more instances of the MAP turbo decoder of claim 3, further comprising:
   a pre-processor coupled to the one or more instances of MAP turbo decoder, and configured to, for each of the one or more instances of the MAP turbo decoder, generate the segment, subdivide the generated segment into the windows, wherein each window comprises a pre-determined number of the systematic and parity bits, and the systematic bits comprise information and Cyclic Redundancy Check (CRC) bits.

7. The one or more instances of the MAP turbo decoder of claim 1, wherein for each received bit of each window of the segment, the extrinsic data is computed in a cycle of a timing signal following a cycle of the timing signal during which a later of the forward and the backward state metric is computed.

8. The one or more instances of the MAP turbo decoder of claim 1, wherein the forward state metric is computed in a same cycle of a timing signal during which the gamma branch metric in a forward direction is computed, and the backward state metric is computed in a same cycle of a timing signal during which the gamma branch metric in a backward direction is computed.

9. The one or more instances of the MAP turbo decoder of claim 1, further comprising a counter coupled to the post-processor and configured to count a number of iterations, wherein the a-priori information for the received bits is from a previous iteration, and the decoded segment is provided by:
   incrementing the counter and proceeding to a next iteration to re-compute the gamma branch metrics and the forward and backward state metrics, when the decoded segment based on the soft decisions is deemed inaccurate and a maximum number of iterations is not reached; and
   providing the decoded segment when either the decoded segment is deemed accurate or the maximum number of iterations is reached.

10. The one or more instances of the MAP turbo decoder of claim 1, wherein the received bits comprise two systematic and two parity bits per cycle of a timing signal, the gamma branch metric in a forward direction is computed based on a first systematic bit of the two systematic bits and a first parity bit of the two parity bits, and the gamma branch metric in a backward direction is computed based on a second systematic bit of the two systematic bits and a second parity bit of the two parity bits.

11. The one or more instances of the MAP turbo decoder of claim 10, wherein the gamma branch metrics in the forward and backward directions are computed concurrently by computing, in each cycle of the timing signal, one gamma branch metric in the forward direction and one gamma branch metric in the backward direction, until the gamma branch metrics in the forward and backward directions are computed for each bit of each window of the segment.

12. The one or more instances of the MAP turbo decoder of claim 2, wherein the computing of the forward and backward state metrics comprises:
   concurrently initializing the forward and backward state metric engines in a same cycle of a timing signal by setting the respective initial values based on values stored in a boundary memory; and
   concurrently and sequentially computing, in each subsequent cycle of the timing signal, one forward and one backward state metric until the forward and backward state metrics are computed for each bit of each window of the segment, wherein the forward state metrics is based on the initialized forward state metric engine and the gamma branch metrics in the forward direction, and the backward state metrics is based on the initialized backward state metric engine and the gamma branch metrics in the backward direction.

13. The one or more instances of the MAP turbo decoder of claim 12, wherein a controller of the instances of the MAP turbo decoder is configured to initialize the forward and backward state metric engines, the initializing comprising:
   determining whether the initializing is for a first iteration;
   when the iteration is determined as being for the first iteration and the forward state metric engine comprises an alpha engine, initializing a first instance of the one or more instances of the MAP turbo decoder with a maximum value, and initializing each instance other than the first with a value of zero;
   when the iteration is determined as being for the first iteration and the forward state metric engine comprises a beta engine, initializing a last instance of the one or more instances of the MAP turbo decoder in accordance with a tailbits-calculated initial value, and initializing each instance other than the last instance with a value of zero; and
   when the iteration is determined as being for an iteration other than for the first iteration, initializing values of alpha and beta in accordance with respective values of alpha and beta stored in boundary memories during a previous iteration.

14. The one or more instances of the MAP turbo decoder of claim 1, wherein the forward state metric engine comprises an alpha engine and the backward state metric engine comprises a beta engine.

15. The one or more instances of the MAP turbo decoder of claim 14, wherein the forward state metrics of the segment is computed sequentially in an increasing bit order, the backward state metrics of the segment is computed sequentially from a first window of the segment to a last window of the segment, and the backward state metrics of a given window is computed in a decreasing bit order.

16. The one or more instances of the MAP turbo decoder of claim 1, wherein the forward state metric engine comprises a beta engine and the backward state metric engine comprises an alpha engine.

17. The one or more instances of the MAP turbo decoder of claim 16, wherein the forward state metrics of the segment is computed sequentially in a decreasing bit order, the backward state metrics of the segment is computed sequentially from a last window of the segment to a first window of the segment, and the backward state metrics of a given window is computed in an increasing bit order.

18. The one or more instances of the MAP turbo decoder of claim 1, further comprising:
   an alpha-beta memory coupled to the forward and backward state metric engines, and configured to store values of the forward and backward state metrics during computations;
   a boundary memory coupled to the forward and backward state metric engines, and configured to store values of the forward and backward state metrics at boundaries of windows and at boundaries of the instances of the MAP turbo decoder; and
   an extrinsic memory coupled to the post-processor, the forward gamma engine, and the backward gamma engine, and configured to store the extrinsic data.

19. The one or more instances of the MAP turbo decoder of claim 18, wherein up to a windows worth of values of alpha and beta are stored in the alpha-beta memory during computation of the forward state metrics, and the stored values of alpha and beta are provided to the backward state metric engine, in a reverse order, when the backward state metrics is being computed.

20. A wireless device, comprising:
   one or more antennas configured to receive a signal over a wireless channel comprising the received code; and
   the one or more instances of the MAP turbo decoder of claim 1, wherein the signal comprises the received code to be turbo decoded.

21. The wireless device of claim 20, wherein the forward and backward state metric engines are configured to compute the forward and the backward state metrics concurrently.

22. A method for decoding a segment of a received code by an instance of one or more instances of a Maximum-A-Posteriori (MAP) turbo decoder, the segment being subdivided into windows, the method comprising:

for each window, concurrently computing, by forward and backward gamma engines respectively, gamma branch metrics in a forward and a backward direction, wherein the gamma branch metrics are based on received bits, a combination of transmitted bits, and a-priori information for the received bits;

for each window, sequentially computing, by forward and backward state metric engines comprising respective lambda engines and coupled to the respective forward and backward gamma engines, a forward and a backward state metric, respectively, and determining, by the lambda engines, Log Likelihood Ratios (LLRs) for received and decoded bits, and soft decisions for the received bits, wherein the forward and the backward state metrics are based on a respective gamma branch metric and a respective initial value; and computing, by a post-processor, extrinsic data based on the forward and backward state metrics, and providing a decoded segment.

23. The method of claim 22, wherein the forward and the backward state metrics are computed concurrently.

24. A device, comprising:

a processor; and a memory configured to store a program instructions to be executed by the processor, where executing the program instructions causes the processor to perform operations for receiving a signal over a wireless channel and decoding a segment of a received code by an instance of one or more instances of a Maximum-A-Posteriori (MAP) turbo decoder, the segment being subdivided into windows, the operations comprising:

concurrently computing, for each window, gamma branch metrics in a forward and a backward direction, wherein the gamma branch metrics are based on received bits, a combination of transmitted bits, and a-priori information for the received bits;

sequentially computing, for each window, a forward and a backward state metric and determining Log Likelihood Ratios (LLRs) for received and decoded bits, and soft decisions for the received bits, wherein the forward and the backward state metrics are based on a respective gamma branch metric and a respective initial value; and computing extrinsic data based on the forward and backward state metrics, and providing a decoded segment.

25. The device of claim 24, wherein the forward and the backward state metrics are computed concurrently.

* * * * *